United States Patent
Iwata et al.

(10) Patent No.: US 6,870,720 B2
(45) Date of Patent: Mar. 22, 2005

(54) DEVICE AND METHOD FOR DETERMINING INTERMITTENT SHORT CIRCUIT

(75) Inventors: Toshinori Iwata, Ogaki (JP); Manabu Ohta, Ogaki (JP)

(73) Assignee: Pacific Engineering Corp., Ogaki ( * ) Notice: Subject to any disclaimer, the term of this patent is extended or adjusted under 35 U.S.C. 154(b) by 216 days.

(21) Appl. No.: 10/057,366

(22) Filed: Jan. 25, 2002

(65) Prior Publication Data

US 2003/0142449 A1 Jul. 31, 2003

(51) Int. Cl.⁷ .................................................. H02H 9/00
(52) U.S. Cl. ........................................... 361/58; 361/87
(58) Field of Search ............................. 361/58, 87, 42, 361/52

(56) References Cited

U.S. PATENT DOCUMENTS 3,629,659 A * 12/1971 Schneider .................... 361/112
4,023,264 A    5/1977 Schmidt, Jr. et al.
4,723,187 A * 2/1988 Howell ........................ 361/13
RE34,107 E * 10/1992 Wirth ........................... 361/18

FOREIGN PATENT DOCUMENTS

| JP | 11-273544 | 10/1999 |
|----|-----------|---------|
| JP | 2000-090808 | 3/2000 |

* cited by examiner

*Primary Examiner*—Hung V. Ngo
(74) *Attorney, Agent, or Firm*—Cherskov & Flaynik

(57) ABSTRACT

A miniaturized cost-saving intermittent short circuit determining device located between a power source and an electric load in a vehicle electric circuit. The determining device includes detecting means for detecting current flowing through the electric circuit, determining means for determining whether the current detected by the detecting means is an intermittent short circuit, and disconnecting means for disconnecting the electric circuit when the determining means judges that there is an abnormality. The determining means is connected to an external switch circuit, which selectively supplies and stops current to the electric load of the electric circuit. The determining means determines whether the external switch circuit is switched on or off, and switches the disconnecting means on or off according to the determination.

21 Claims, 11 Drawing Sheets

Fig.9
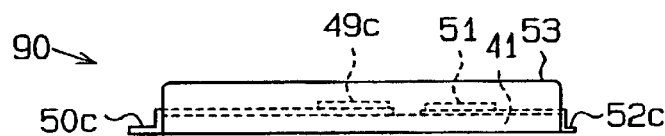
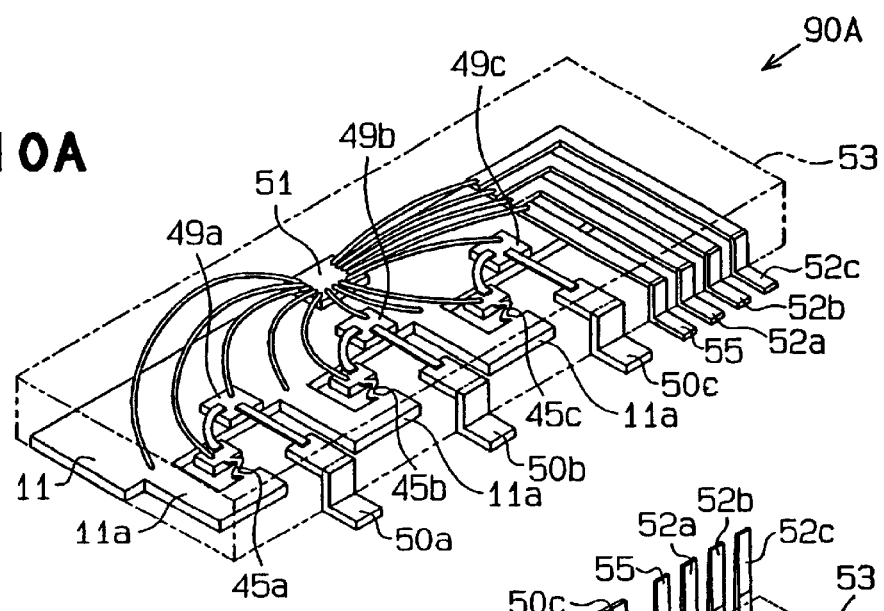
Fig.10A
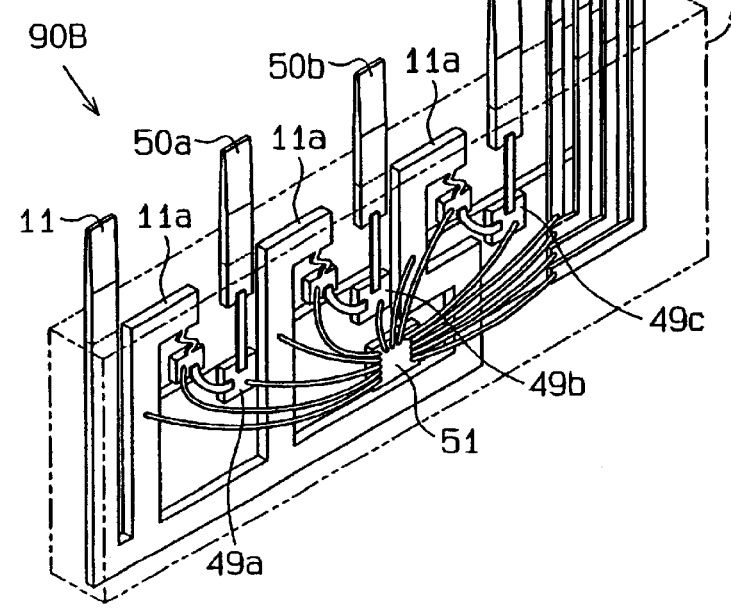
Fig.10B

DEVICE AND METHOD FOR DETERMINING INTERMITTENT SHORT CIRCUIT

BACKGROUND OF THE INVENTION

The present invention relates to a device and method for determining the occurrence of an intermittent short circuit. More particularly, the present invention relates to an intermittent short circuit determining device and an intermittent short circuit determining method that detects overcurrent flowing through an electric circuit of an automobile.

U.S. Pat. No. 4,023,264 describes a blade fuse installed in a fuse box of an automobile. Blade fuses, which are often used in electric circuits of automobiles, have a slow-burn characteristic. Due to the slow-burn characteristic, blade fuses are not melted by momentary excess currents but are melted by continuous excess currents that flow for a certain period of time.

Blade fuses normally melt and break when a dead short circuit occurs but do not break when an intermittent short circuit occurs. A dead short circuit causes a large amount of current to continuously flow in an electric circuit. An intermittent short circuit causes current to flow intermittently and within a short period of time in an electric circuit. An intermittent short circuit is a short circuit, which occurs when, for example, vibrations cause the electric wiring of an automobile to contact the body of the automobile. When an intermittent short circuit current continuously flows through the electric circuit of the automobile, for example, the electric circuit may be over-supplied with current. Thus, there is a need for an intermittent short circuit determining device that accurately detects the occurrence of an intermittent short circuit.

One of the inventors of the present invention disclosed intermittent short circuit determining devices in Japanese Unexamined Patent Publication Nos. 11-273544 (Japanese Patent Application No. 10-90866) and 2000-90808 (Japanese Patent Application No. 10-255204). The disclosed intermittent short circuit determining devices accurately detect the occurrence of intermittent short circuits. However, the prior art intermittent short circuit determining devices include separate parts for determining the occurrence of an intermittent short circuit and for disconnecting the electric circuit. This makes the prior art intermittent short circuit determining devices large and expensive.

SUMMARY OF THE INVENTION

It is an object of the present invention to provide a device and method for detecting the occurrence of an intermittent short circuit more accurately.

A further object of the present invention is to provide a compact and inexpensive intermittent short circuit determining device.

To achieve the above object, the present invention provides an intermittent short circuit determining device located between a power source and a load circuit in a vehicle electric circuit. The intermittent short circuit determining device includes detecting means for detecting current flowing through the load circuit, determining means for determining whether the current detected by the detecting means is an intermittent short circuit, and disconnecting means for disconnecting the load circuit when the determining means judges that there is an abnormality. The determining means is selectively connected to an external switch circuit, which selectively supplies and stops current to the load circuit. The determining means determines whether the external switch circuit is switched on or off, and switches the disconnecting means on or off according to the determination.

The present invention also provides an intermittent short circuit determining device for determining whether an intermittent short circuit has occurred in a load circuit. The rare short circuit determining device includes detecting means, determining means and disconnecting means. The detecting means is for detecting a load current, which flows through the load circuit, and for generating a detection signal. The determining means is connected to the sensor. The determining means determines whether an intermittent short circuit has occurred based on the detection signal. The disconnecting means is connected to the determining means. The disconnecting means stops the supply of the load current to the load circuit when it is determined that an intermittent short circuit has occurred. The determining means determines whether an intermittent short circuit has occurred based on at least one of four characteristic values. The characteristic values include the value of a load current flowing through the load circuit, a time period during which the load current exceeds a current threshold value, an ON-duty ratio indicating the ratio of a time period when the load current exceeds the current threshold value relative to a predetermined time period, and an actual overcurrent number indicating the number of times that the load current exceeds the current threshold value during a predetermined time period. The determining circuit switches the disconnecting means off according to the determination.

The present invention also provides a method for determining the occurrence of an intermittent short circuit in a load circuit. The method includes at least one of four comparing steps including a current comparison step, a time period comparison step, a duty ratio comparison step, and an overcurrent number comparison step. The current comparison step compares the value of a load current flowing through the load circuit with a current threshold value. The time period comparing step compares a time period during which the load current exceeds the current threshold value with a reference time period. The duty ratio comparison step compares an ON-duty ratio with a reference ON-duty ratio. The ON-duty ratio indicates the ratio of a time period during which the load current exceeds the current threshold value relative to a predetermined time period. The overcurrent number comparison step compares an actual overcurrent number indicating the number of times that the load current exceeds the current threshold value during the predetermined time period with a reference overcurrent number.

A further aspect of the present invention is a method for determining whether an intermittent short circuit has occurred in a load circuit. The method includes comparing the value of a load current that flows in the load circuit with a first current threshold value, comparing the load current value with a second current threshold value, the second current threshold value being greater than the first current threshold value, comparing a first time period, during which the load current exceeds the first current threshold value, with a first reference time period, comparing a second time period, during which the load current exceeds the second current threshold value, with a second reference time period, comparing an ON-duty ratio with a reference ON-duty ratio, wherein the ON-duty ratio is the ratio of a time period when the load current exceeds the second current threshold value relative to a predetermined time period, and comparing an overcurrent number with a reference overcurrent number, wherein the overcurrent number is the number of times that the load current exceeds the second current threshold value during a predetermined time period.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIG. 9 is a schematic right side view of the intermittent short circuit determining device of FIG. 7 in a moulded state;

FIG. 10A is a schematic perspective view illustrating a different embodiment of the intermittent short circuit determining device of FIG. 7;

FIG. 10B is a schematic perspective view illustrating a different embodiment of the intermittent short circuit determining device of FIG. 7;

DETAILED DESCRIPTION OF THE PREFERRED EMBODIMENTS

Figure 1:
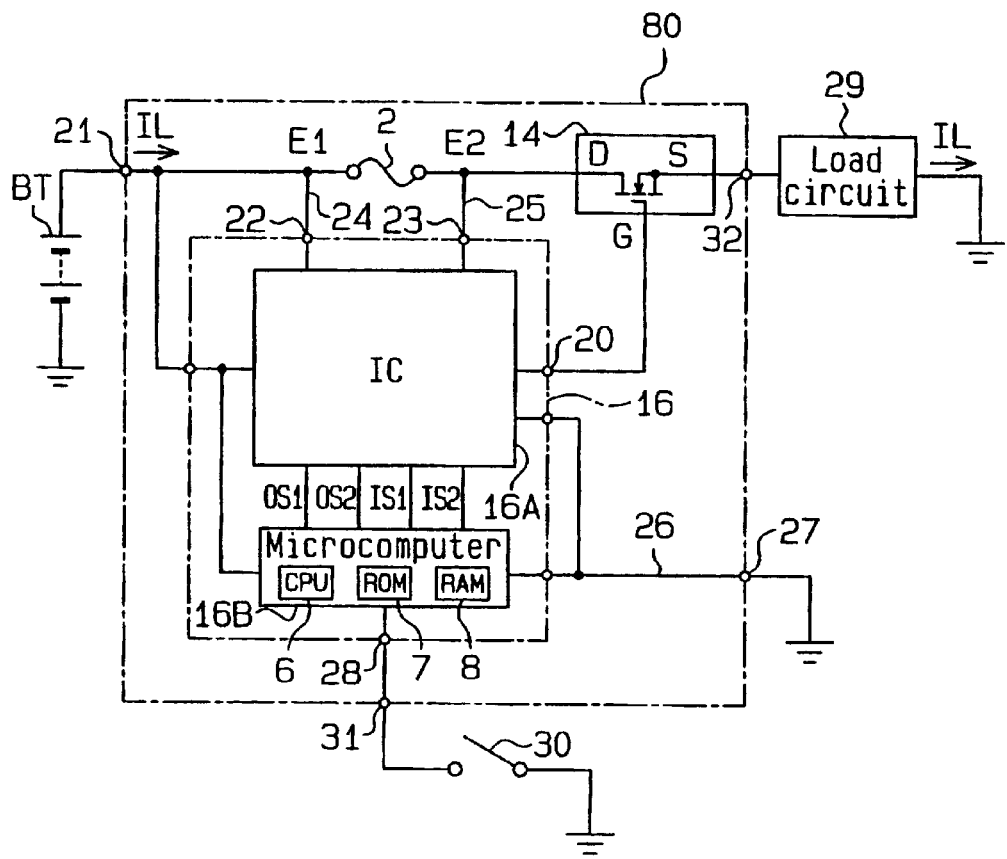
FIG. 1 is a schematic circuit diagram of an intermittent short circuit determining device according to a first embodiment of the present invention.

In the drawings, like numerals are used for like elements throughout.

(First Embodiment)

Figure 2:
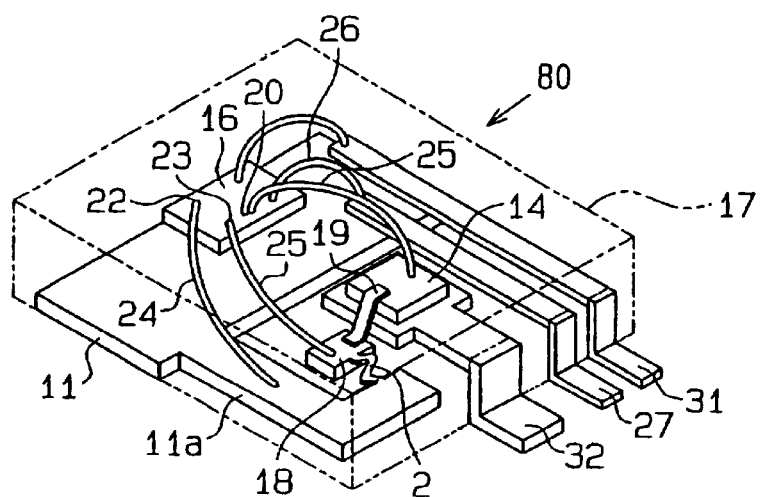
FIG. 2 is a schematic perspective view of the intermittent short circuit determining device of FIG. 1.

FIG. 1 is a schematic circuit diagram of an intermittent short circuit determining device 80 according to a first embodiment of the present invention. FIG. 2 is a schematic perspective view of the intermittent short circuit determining device 80. The intermittent short circuit determining device 80 is embodied in an automobile intermittent short circuit determining device. The intermittent short circuit determining device 80 is connected to a terminal block (not shown), which is included in an electric circuit of the automobile.

As shown in FIG. 2, the intermittent short circuit determining device 80 includes a conductive terminal 11, a signal input terminal 31, a current sensor (detecting means) 2, a relay circuit (disconnecting means) 14, an output terminal 32, a determining circuit (determining means) 16, and a relay electrode 18. The relay circuit 14 includes a power MOSFET (hereinafter, simply referred to as FET).

The intermittent short circuit determining device 80 includes a molded material such as a molded package 17, which is made of epoxy resin. The intermittent short circuit determining device 80 is formed into a flat hexahedron. The conductive terminal 11 is flat and located on one side of the package 17. An insulation (not shown), is formed on the inner surface of the conductive terminal 11. The determining circuit 16 is located on the inner surface of the conductive terminal 11. The insulation is not formed on the outer surface (bottom surface in FIG. 2) of the conductive terminal 11.

The conductive terminal 11 includes an L-shaped branching arm 11a. The relay electrode 18 is located inside the branching arm 11a, as shown in FIG. 2. The branching arm 11a is connected to the relay electrode 18 by the current sensor (thin fuse) 2. The current sensor 2 has a predetermined impedance Z. The current sensor 2 has a current capacity such that the current sensor 2 does not break when a current greater than or equal to a predetermined reference value (overcurrent) constantly flows for a predetermined reference time period.

The output terminal 32 is bent in an L-shaped manner outside the package 17 as shown. The FET 14 is located on the flat surface of the output terminal 32 inside the package 17. The drain of the FET 14 is connected to the relay electrode 18 by a conductive bar 19. The source of the FET 14 is connected to the output terminal 32. The gate of the FET 14 is connected to a relay circuit control terminal 20 of the determining circuit 16 (see FIG. 1).

Input terminals 22, 23 of the determining circuit 16, which is shown in FIG. 1, are connected to the conductive terminal 11 and the relay electrode 18 by lead wires 24, 25, respectively, as shown in FIG. 2. The conductive terminal 11 and the relay electrode 18 are connected to the ends of the current sensor 2, respectively. The determining circuit 16 constantly receives the detection signal (voltage) through the conductive terminal 11 and the input terminals 22, 23.

A ground terminal 27 is bent in an L-shaped manner outside the package 17. The end of the ground terminal 27 inside the package 17 is connected to the determining circuit 16 by a lead wire 26.

If one of the determining circuit 16 and the FET 14 in the intermittent short circuit determining device 80 does not function properly and a dead short circuit occurs, the current sensor 2, which functions as a fuse, breaks and the current supply to a load circuit 29 is stopped.

As shown in FIG. 2, the signal input terminal 31 is bent in an L-shaped manner outside the package 17. The end of the signal input terminal 31 in the package 17 is connected to an external signal input terminal 28 of the determining circuit 16.

The signal input terminal 31 is connected to an external switch 30 of the automobile. When the external switch 30 is turned on, the signal input terminal 31 receives a switch ON signal (current control signal). When the external switch 30 is turned off, the signal input terminal 31 receives a switch OFF signal (current control signal).

The determining circuit 16 includes an IC 16A and a microcomputer 16B. The determining circuit 16 determines whether an intermittent short circuit has occurred. That is, the IC 16A receives the voltage on each terminal of the current sensor 2 (potential difference) through the input terminals 22, 23. The determining circuit 16 determines whether the received potential difference (load current) is greater than or equal to the predetermined threshold value by comparing the received voltages. The determining circuit 16 provides the result to the microcomputer 16B.

The microcomputer 16B includes a CPU 6, a ROM, and a RAM. The intermittent short circuit determining program and a close/open control program are stored in the ROM 7. The operation memory is stored in the RAM 8. The microcomputer 16B determines whether an intermittent short circuit has occurred based on the intermittent short circuit determining program.

The battery BT of the automobile is connected to a load circuit 29 via the current sensor 2 and a power MOSFET 14, or relay circuit. The load circuit 29 includes, for example, a headlamp or a radio. Further, the load circuit 29 includes the electric wiring (electric lines) connected to the headlamp or the radio.

Figure 3:
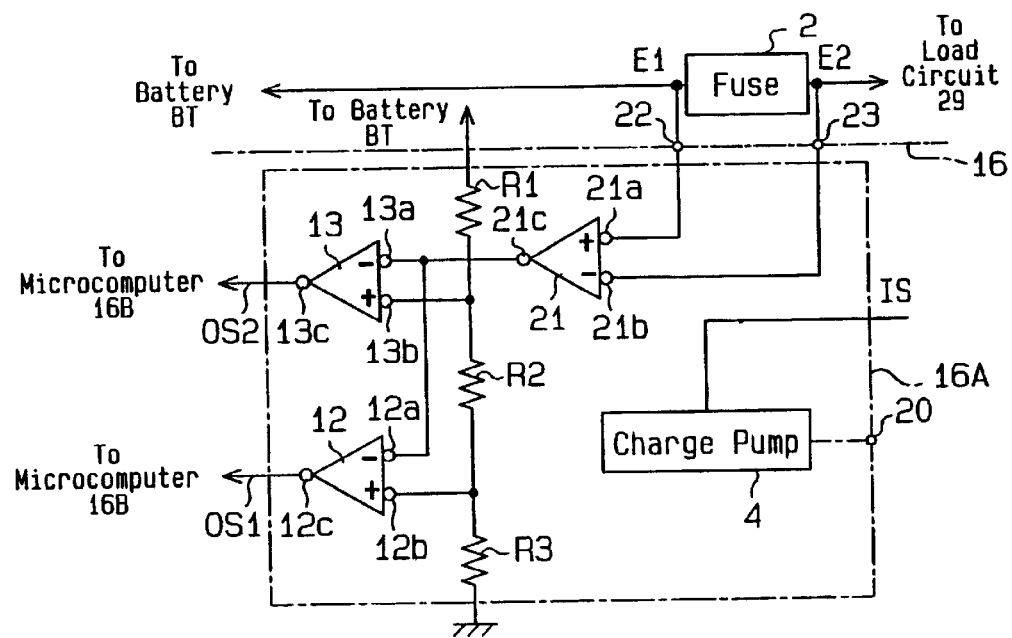
FIG. 3 is a schematic circuit diagram of an IC in the intermittent short circuit determining device of FIG. 1.

The determining circuit 16 of the intermittent short circuit determining device 80 will now be discussed. FIG. 3 is a schematic circuit diagram of the IC 16A of the determining circuit 16.

The IC 16A includes a differential amplifier circuit 21, a first comparator circuit 12, a second comparator circuit 13, resistors R1, R2, R3, and a charge pump 4. The IC 16A is connected to the microcomputer 16B via input signal lines IS1, IS2 and output signal lines OS1, OS2.

A non-inverting input terminal (hereinafter, referred to as positive terminal) 21a of the differential amplifier circuit (operation amplifier) 21 is connected to the input terminal 22. A potential E1 at the battery side of the currnt sensor 2 is supplied to the positive terminal 21a of the differential amplifier circuit 21.

An inverting input terminal (hereinafter, referred to as negative terminal) 21b of the differential amplifier circuit 21 is connected to the input terminal 23. A potential E2 at the load side of the currnt sensor 2 is supplied to the negative terminal 21b of the differential amplifier circuit 21.

When the differential amplifier circuit 21 receives both potentials E1, E2 from the currnt sensor 2 as detection signals, the potential difference (E1−E2) is amplified by a predetermined factor. The potential difference (E1−E2) is amplified by N (N>0) times in the first embodiment. This generates an amplified voltage Va (Va=N×(E1−E2)). The amplified voltage Va is supplied from the output terminal 21c to a negative terminal 12a of the first comparator circuit (operation amplifier) 12 and to a negative terminal 13a of the second comparator circuit (operation amplifier) 13.

The potential difference (E1−E2) is produced between the two terminals of the currnt sensor 2 when the load current (detected current) IL that flows through the load circuit 29 and the currnt sensor 2 has a current value Id. The potential difference is described by "impedance Z×load current value Id". Therefore, the amplified voltage Va is represented by the following equation.

$$Va = N \times (E1-E2) = N \times Z \times Id$$

The amplified voltage Va is proportional to the current value Id, and the impedance Z is substantially constant. Thus, the current value Id represents the amplified voltage Va.

The output terminal 21c of the differential amplifier circuit 21 is connected to the negative terminal 12a of the first comparator circuit 12. A non-inverting input terminal, or a positive terminal 12b, of the first comparator circuit 12 is connected to a median point between the resistors R2 and R3. A first voltage threshold value VT1, which is represented by the following equation, is applied to the positive terminal 12b. The voltage value of the battery power source BT is represented by VB, the resistance value of the resistor R1 is represented by RA, the resistance value of the resistor R2 is represented by RB, and the resistance value of the resistor R3 is represented by RC.

$$VT1 = (VB \times RC)/(RA+RB+RC))$$

An output terminal 12c of the first comparator circuit 12 is connected to the microcomputer 16B via the output signal line OS1.

In the first embodiment, the first voltage threshold value VT1 is set such that it is equal to the amplified voltage Va when the load current IL, which is equal to a first current threshold value A1, flows to the load circuit 29. The first current threshold value A1 is within the current capacity range of the current supply lines.

The first comparator circuit 12 compares the amplified voltage Va with the first voltage threshold value VT1. That is, the first comparator circuit 12 determines whether the current value Id is greater than the first current threshold value A1.

When the current value Id (amplified voltage Va) is less than or equal to the first current threshold value A1 (first voltage threshold value VT1), the first comparator circuit 12 provides the microcomputer 16B with a first comparison signal having a high level. When the load current value Id is greater than the first current threshold value A1, the first comparator circuit 12 provides the microcomputer 16B with the first comparison signal at a low level.

The output terminal 21c of the differential amplifier circuit 21 is connected to the negative terminal 13a of the second comparator circuit (operation amplifier) 13. A positive terminal 13b of the second comparator circuit 13 is connected to a median point between the resistors R1 and R2. That is, a second voltage threshold value VT2, which is represented by the following equation, is applied to the positive terminal 13b.

$$VT2 = (VB \times (RB+RC)/(RA+RB+RC))$$

An output terminal 13c of the second comparator circuit 13 is connected to the microcomputer 16B via the output signal line OS2.

In the first embodiment, the second voltage threshold value VT2 is set such that it is equal to the amplified voltage Va when the load current IL, which is equal to a second current threshold value A2, flows to the load circuit 29.

After receiving the amplified voltage Va from the differential amplifier circuit 21, the second comparator circuit 13 compares the amplified voltage Va with the second voltage threshold value VT2. The second comparator circuit 13 determines whether the load current value Id is greater than the second current threshold value A2. When the load current value Id (amplified voltage Va) is less than or equal to the second current threshold value A2 (second voltage threshold value VT2), the second comparator circuit 13 provides the microcomputer 16B with a second comparison signal having a high level. When the load current value Id is greater than the second current threshold value A2, the second comparator circuit 13 supplies the microcomputer 16B with the second comparison signal at a low level. The microcomputer 16B determines whether the load current value Id is greater than the reference value (A1, A2).

In the first embodiment, the microcomputer 16B determines whether an intermittent short circuit has occurred based on the following four characteristic values:

1. A first time period TA during which the load current IL exceeds the first current threshold value A1;
2. A second time period TB during which the load current IL exceeds the second current threshold value A2;
3. Ratio DU of the sum of second time period TB to a predetermined time period (ON-duty ratio, hereinafter, referred to as DUTY ratio); and
4. An overcurrent number KS indicating the number of times that the load current IL exceeds a second current threshold value A2 during a predetermined time period.

An output terminal of the IC 16A is connected to the first output terminal 20 of the determining circuit 16. The first output terminal 20 is connected to the gate of the FET 14. When the IC 16A receives a current flow permission signal (first mode signal) from the microcomputer (processing circuit) 16B, the IC 16A charges a charge pump 4 and generates a FET ON signal that activates the FET 14. The FET ON signal is sent to the gate of the FET 14 via the first output terminal 20. When the FET ON signal is sent to the gate, the portion between the drain and source of the FET 14 are connected. This supplies the load circuit 29 with the load current IL.

When the IC 16A receives a current shutdown signal (second mode signal) from the microcomputer 16B, the IC 16A discharges the charge pump 4 and generates a FET OFF signal, which inactivates the FET 14. When the FET OFF signal is provided to the gate, the drain and the source are disconnected. This stops the supply of the load current IL to the load circuit 29.

Another output terminal (not shown) of the IC 16A is connected to a light-emitting diode (hereinafter, referred to as LED) on the automobile. When the IC 16A receives a LED ON signal from the microcomputer 16B, a LED goes on. When the IC 16A receives a LED OFF signal from the microcomputer 16B, the LED goes off. The LED is, for example, installed in an instrument panel of the automobile (not shown).

Figure 4:
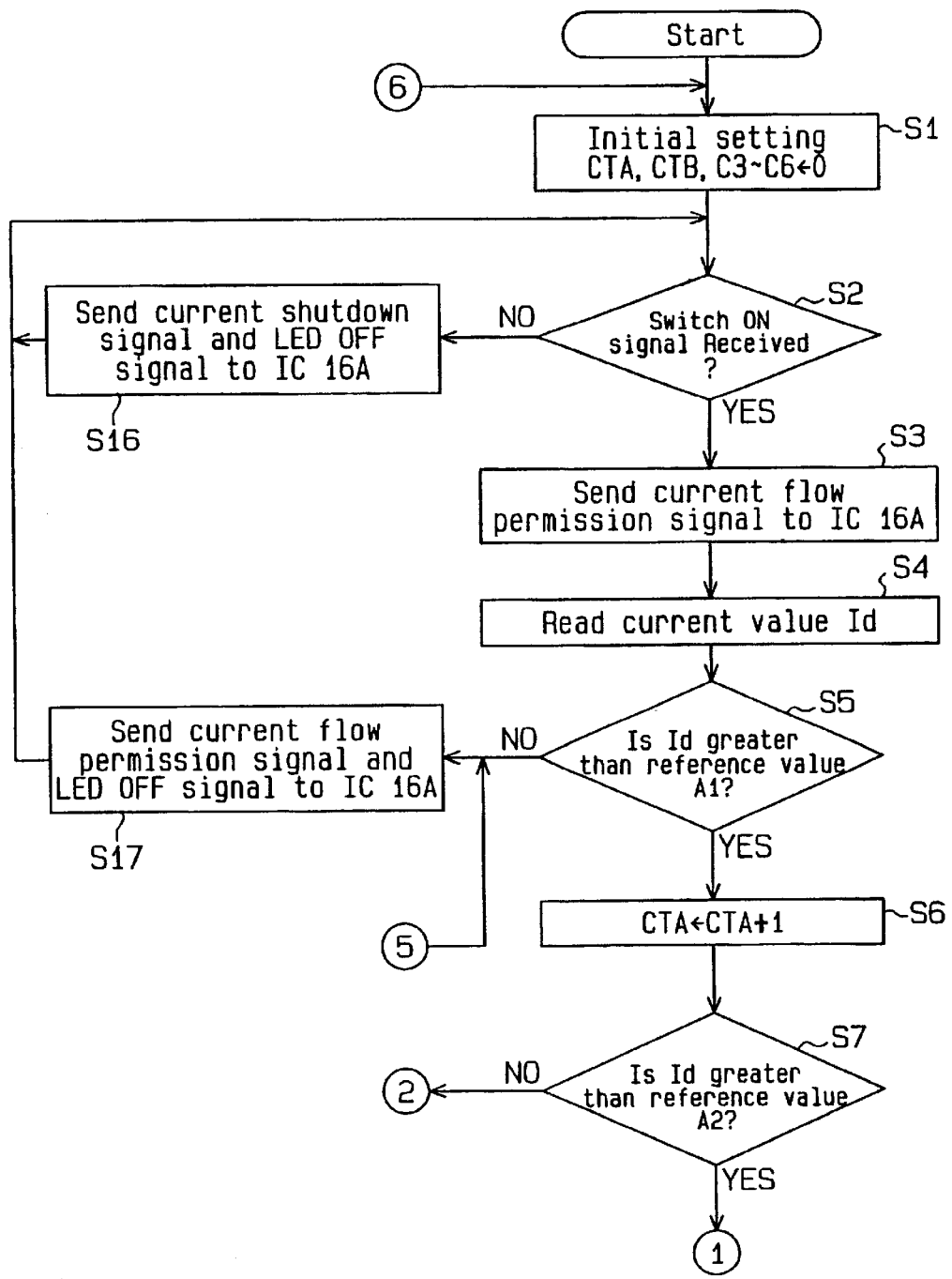
FIG. 4 is a flowchart illustrating an intermittent short circuit determining control program executed by a determining circuit of the intermittent short circuit determining device of FIG. 1.
Figure 5:
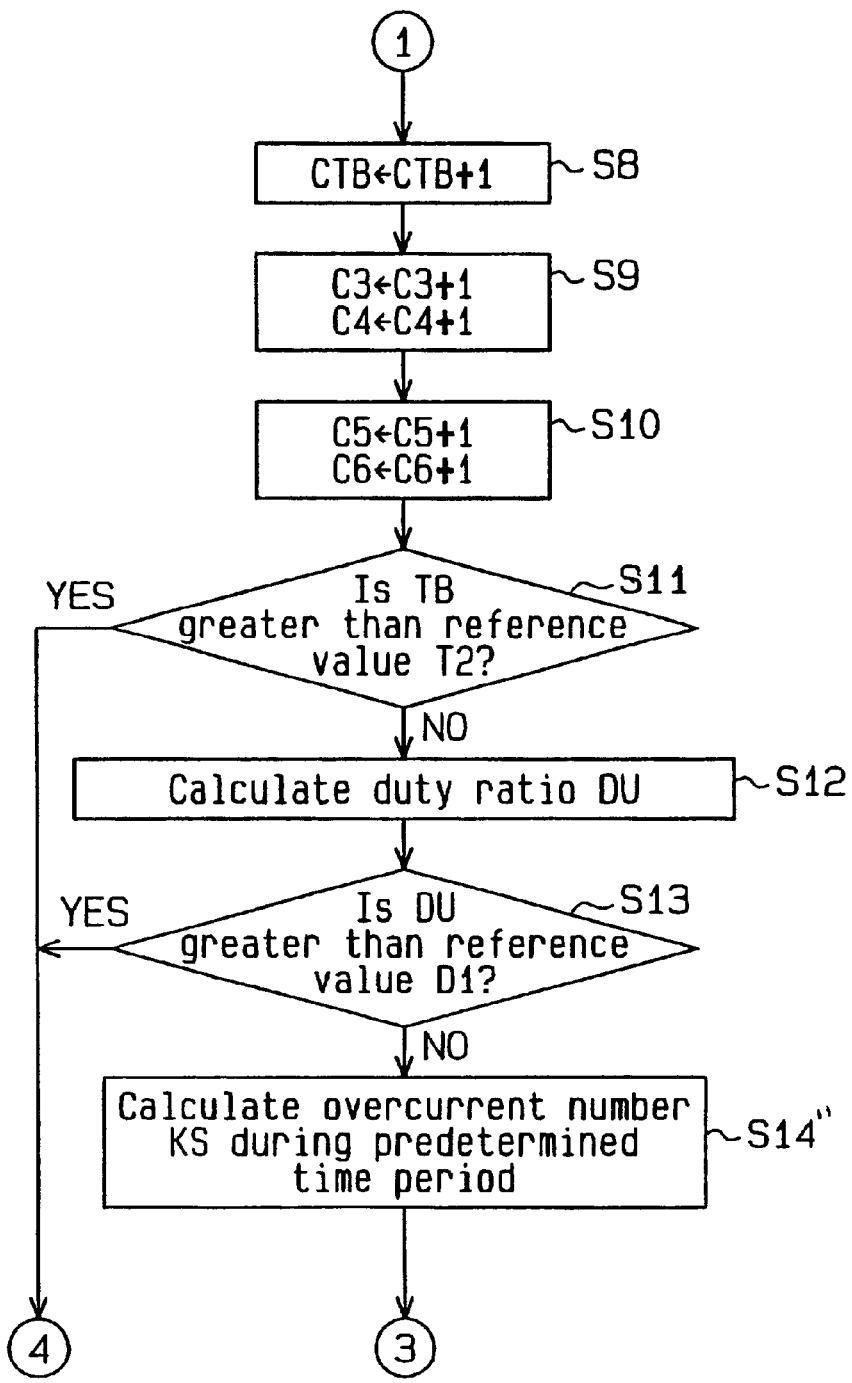
FIG. 5 is a flowchart illustrating an intermittent short circuit determining control program executed by a determining circuit of the intermittent short circuit determining device of FIG. 1.
Figure 6:
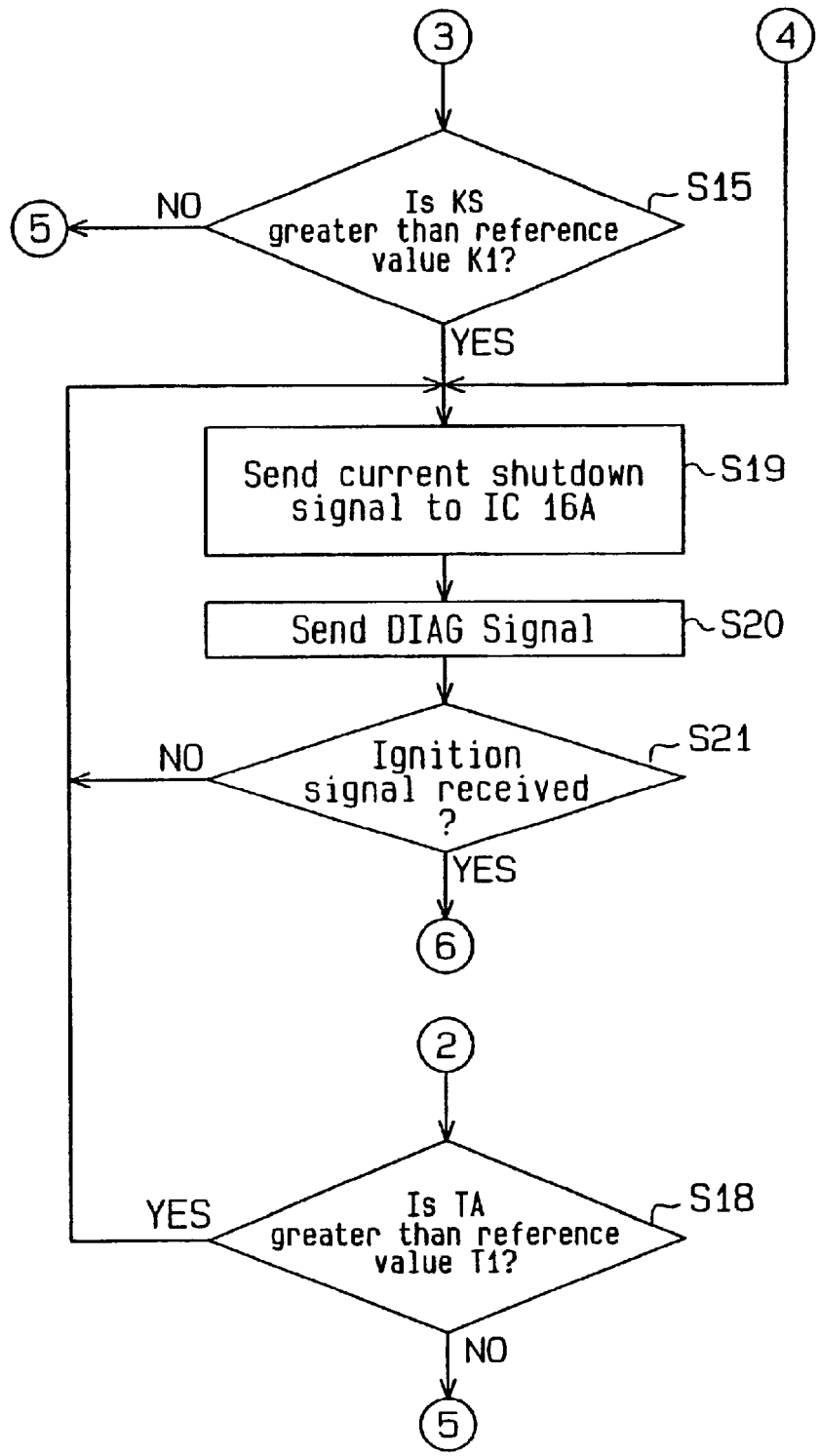
FIG. 6 is a flowchart illustrating an intermittent short circuit determining control program executed by a determining circuit of the intermittent short circuit determining device of FIG. 1.

The operation of the intermittent short circuit determining device 80 will now be described. FIGS. 4, 5, and 6 are flowcharts illustrating the process of the intermittent short circuit determining program. The program is executed by the CPU 6 of the determining circuit 16.

The CPU 6 determines whether an intermittent short circuit has occurred in the electric circuit based on the intermittent short circuit determining program. When it is determined that an intermittent short circuit has not occurred, current is supplied to the load circuit 29. When it is determined that an intermittent short circuit has occurred, the supply of current to the load circuit 29 is stopped.

When the microcomputer 16B is supplied with a battery voltage VB from the battery power source BT, the CPU 6 resets counters CTA, CTB, C3, C4, C5, and C6 to zero in step S1. Then, the CPU 6 proceeds to step S2.

In step S2, the CPU 6 determines whether the switch ON signal has been provided. If it is determined that the switch ON signal has not been received, the CPU 6 proceeds to step S16. If it is determined that the switch ON signal has been received, the CPU 6 proceeds to step S3.

In step S16, the CPU 6 supplies the IC 16A with the current shutdown signal and the LED OFF signal. When the IC 16A receives the current shutdown signal, the IC 16A generates the FET OFF signal. The IC 16A inactivates the FET 14 based on the FET OFF signal. When the IC 16A receives the LED OFF signal, the IC 16A turns off the LED accordingly. The CPU 6 then returns to step S2.

In step S3, the CPU 6 provides the IC 16A with the current flow permission signal. Upon receipt of the current flow permission signal, the IC 16A generates the FET ON signal, which activates the FET 14 accordingly.

In step S4, the CPU 6 receives the load current value Id and proceeds to step S5. In step S5, the CPU 6 determines whether the current value Id is greater than the first current threshold value A1 based on the first and the second comparison signals.

When the first and second comparison signals are high, the CPU 6 determines that the current value Id is less than or equal to the first current threshold value A1. When the first comparison signal is low and the second comparison signal is high, the CPU 6 determines that the current value Id is greater than the first current threshold value A1.

If it is determined that the current value Id is greater than the first current threshold value A1, the CPU 6 proceeds to step S6. If it is determined that the current value Id is less than or equal to the first current threshold value A1, the CPU 6 proceeds to step S17.

In step S17, the CPU 6 supplies the IC 16A with the current flow permission signal and the LED OFF signal. Upon receipt of the current flow permission signal, the IC 16A generates the FET ON signal, which activates the FET 14 accordingly. This allows the current to be supplied to the load circuit 29. Upon receipt of the LED OFF signal, the IC 16A turns off the LED. The microcomputer 16B then returns to step S2.

In step S6, the CPU 6 increments the counter CTA by a value of one and proceeds to step S7. The counter CTA calculates the first time period TA during which the continuous load current IL exceeds the first current threshold value A1.

In step S7, the CPU 6 determines whether the current value Id is greater than the second current threshold value A2 according to the first and the second comparison signals.

When the first and the second comparison signals are low, the CPU 6 determines that the current value Id is greater than the second current threshold value A2 and proceeds to step S8. When the first comparison signal is low and the second comparison signal is high, the CPU 6 determines that the current value Id is less than or equal to the second current threshold value A2 and proceeds to step S8.

If it is determined that the current value Id is greater than the second current threshold value A2, the CPU 6 proceeds to step S8. If it is determined that the current value Id is less than or equal to the second current threshold value A2, the CPU 6 proceeds to step S18.

In step S18, the CPU 6 determines whether the first time period TA is greater than the first reference time period T1. If it is determined that the first time period TA is greater than the first reference time period T1, the CPU 6 determines that the dead short may occur and proceeds to step S19. If it is determined that the first time period TA is less than or equal to the first reference time period T1, the CPU 6 proceeds to step S17.

In step S19, CPU 6 supplies the IC 16A with the current shutdown signal and the LED ON signal. Upon receipt of the current shutdown signal, the IC 16A generates the FET OFF signal, which inactivates the FET 14 accordingly. When the FET 14 is inactivated, the current supply to the load circuit 29 is stopped. This prevents the dead short circuit from occurring and protects the load circuit 29 against the overcurrent caused by the dead short circuit. Upon receipt of the LED ON signal, the IC 16A turns on the LED. The CPU 6 proceeds to step S20.

In step S20, the CPU 6 send a DIAG signal and executes a self-diagnostic test. The CPU 6 then proceeds to step S21. In step S21, the CPU 6 determines whether an ignition signal of the automobile has been received. If it is determined that the ignition signal has not been received, the CPU 6 proceeds to step S19. If it is determined that the ignition signal is received, the CPU 6 proceeds to step S1.

If it is determined in step S7 of FIG. 4 that the load current value Id is greater than the second current threshold value A2, the CPU 6 increments the count value of the counter CTB in step S8. The counter CTB calculates a second time period TB during which the continuous current IL exceeds the second current threshold value A2. The CPU 6 then proceeds to step S9.

In step S9, the CPU 6 increments the count value of an ON time period counter C3 and proceeds to step S10. The ON time period counter C3 adds up the ON time of the load current IL.

In step S10, the CPU 6 increments each count value of an overcurrent counter C5 and a time period counter C6, and proceeds to step S11. The overcurrent counter C5 calculates the overcurrent number, by which the load current IL exceeds the second current threshold value A2.

In step S11, the CPU 6 determines whether the second time period TB is greater than a second reference time period T2 (T2<T1). If it is determined that the second time period TB is greater than the second reference time period T2, the CPU 6 determines that an intermittent short circuit has occurred and proceeds to step S19. In step S19, the CPU 6 provides the IC 16A with the current shutdown signal and inactivates the FET 14.

In step S11, if it is determined that the second time period TB is less than or equal to the second reference time period T2, the CPU 6 proceeds to step S12. In step S12, the microcomputer 16B calculates the ratio DU (duty ratio) of the ON time period of the load current IL to the predetermined time period. The microcomputer 16B calculates the ratio DU based on the value of the ON time period counter C3.

In step S13, CPU 6 determines whether the duty ratio DU is greater than a reference duty ratio D1. If it is determined that the duty ratio DU is greater than the reference duty ratio D1, the CPU 6 determines that an intermittent short circuit has occurred and proceeds to step S19. In step S19, the CPU 6 provides the IC 16A with the current shutdown signal and inactivates the FET 14. This protects the load circuit 29. If it is determined that the duty ratio DU is less than or equal to the reference duty ratio D1, the CPU 6 proceeds to step S14.

In step S14, the CPU 6 calculates the overcurrent number KS, which is the number of times the load current IL exceeds the second current threshold value A2 during the predetermined time period. The CPU 6 calculates the overcurrent number KS based on the value of the overcurrent counter C5 and the value of the time period counter C6.

In step S15, the CPU 6 determines whether the overcurrent number KS is greater than the reference overcurrent number K1. If it is determined that the overcurrent number KS is greater than a reference overcurrent number K1, the CPU 6 determines that an intermittent short circuit has occurred and proceeds to step S19. In step S19, the CPU 6 supplies the IC 16A with the current shutdown signal and inactivates the FET 14. This protects the load circuit 29. If it is determined that the overcurrent number KS is less than or equal to the reference overcurrent number K1, the CPU 6 proceeds to step S17.

The first and second reference time periods T1, T2, the reference duty ratio D1, and the reference overcurrent number K1 are stored in the ROM 7.

The microcomputer 16B receives the switch ON signal when the external switch 30 is switched on. The microcomputer 16B closes the FET 14 based on the close/open control program. The microcomputer 16B provides the signal to the gate of the FET 14 via the relay circuit control terminal 20 of the IC 16A to activate the FET 14.

The microcomputer 16B receives the switch OFF signal when the external switch 30 is turned off. The microcomputer 16B opens the FET 14 based on the close/open control program. The microcomputer 16B provides the signal to the gate of the FET 14 via the relay circuit control terminal 20 of the IC 16A to inactivate the FET 14.

The intermittent short circuit determining device 80 according to the first embodiment provides the following advantages.

(1) The CPU 6 inactivates the FET 14 and stops the supply of current to the load circuit 29 when it is determined that the following conditions are met. The load current value Id is greater than the first current threshold value A1 and is less than or equal to the second current threshold value A2. The first time period TA is greater than the first reference time period T1. This prevents a dead short circuit from occurring and protects the load circuit 29 of the automobile.

(2) The CPU 6 determines that a dead short circuit has occurred when the following conditions are met. The load current value Id is greater than the second current threshold value A2. The second time period TB is greater than the second reference time period T2. Then, the CPU 6 inactivates the FET 14 and stops the supply of current to the load circuit 29. This protects the electric lines from overcurrent caused by a dead short circuit.

(3) The CPU 6 determines that an intermittent short circuit has occurred when the following conditions are met. The load current value Id is greater than the second current threshold value A2. The second time period TB is less than or equal to the second reference time period T2. The duty ratio DU of the detected current IL is greater than the reference duty ratio D1. Then, the CPU 6 inactivates the FET 14 and stops the supply of current to the load circuit 29. This protects the electric lines from overcurrent caused by an intermittent short circuit.

(4) The CPU 6 determines that an intermittent short circuit has occurred when the following conditions are met: the load current value Id is greater than the second current threshold value A2; the second time period TB is less than or equal to the second reference time period T2; the duty ratio DU is less than or equal to the reference value D1; and the overcurrent number KS is greater than the reference overcurrent number K1. Then, the CPU 6 inactivates the FET 14 and stops the supply of current to the load circuit 29. This protects the electric lines from overcurrent caused by the intermittent short circuit.

(5) The current sensor 2 functions as a fuse. Therefore, even if the determining circuit 16 or the FET 14 fails to function because of, for example, the occurrence of a dead short circuit in the load circuit 29, the current sensor 2 breaks as a fuse and stops the supply of current to the load circuit 29.

(6) The determining circuit 16 of the intermittent short circuit determining device 80 is connected to the external switch 30 (external switch circuit). The external switch 30 determines whether or not to supply the load current IL to the load circuit 29. When it is determined to switch the external switch 30 on, the determining circuit 16 activates the FET 14. When it is determined to switch the external switch 30 off, the determining circuit 16 inactivates the FET 14. Therefore, the current supply to the load circuit 29 is controlled by the operation of the external switch 30.

(7) The intermittent short circuit determining device 80 includes the currnt sensor 2, the FET 14, and the determining circuit 16, which are integrated in the molded package 17. Thus, the size of the intermittent short circuit determining device 80 is reduced and it is inexpensive.

(8) The relay circuit includes the FET 14. As a result, the configuration of the relay circuit is simplified and the size of the intermittent short circuit determining device 80 is reduced. The size reduction is also advantageous for packaging the device 80.

The first embodiment of the present invention may be changed as follows.

In step S5 of FIG. 4, if it is determined that the load current value Id is greater than the first current threshold value A1, the CPU 6 may proceed to step S18. In step S18, if it is determined that the first time period TA is less than or equal to the first reference time period T1, the CPU 6 may proceed to step S7.

In step S5 of FIG. 4, if it is determined that the load current value Id is greater than the first current threshold value A1, the CPU 6 may proceed to step S19. In this case, the steps S6, S7, S8, S9, S10, S11, S12, S13, S14, S15, and S18 are omitted.

The IC 16A may have only one comparator circuit. The IC 16A may also have more than three comparator circuits.

The first mode signal and the second mode signal may be formed of only the current flow permission signal and the current shutdown signal, respectively.

The current threshold value, the reference duty ratio, and the reference overcurrent number K1 are set as required. That is, different current threshold values may be set as the load current Id. Load current ranges are defined by the current threshold values. At least one of the reference ON duty ratio and the reference overcurrent number K1 may be set in correspondence with each load current range. In this case, the intermittent short circuit determining program is executed for each load current range.

The following tables 1, 2 and 3 show the examples of combinations of conditions for the CPU 6 to determine that an intermittent short circuit has occurred. The occurrence of an intermittent short circuit may be determined based on the combinations listed in the tables 1 to 3. Each combination of circles in a column indicates abnormal conditions.

Table 1 shows load current ranges defined by the current threshold values A1, A2, A3, A4, A5 (A1<A2<A3<A4<A5) and duty ratio areas defined by the duty ratios D1, D2, D3, D4, D5 (D1<D2<D3<D4<D5). The row marked "A1≦" indicates that A1≦load current<A2. The circles in the lowest row of the current value and in the lowest row of the duty ratio indicate that each of the detected value is greater than or equal to the indicated value of the associated row. For example, the circle in the row marked "A5≦" represents that the detected value is greater than or equal to A5. For example, "D1≦duty ratio<D2" corresponds to "A1≦load current<A2". When the combination is "A1≦load current<A2" and "D1≦duty ratio<D2", it is determined that an intermittent short circuit has occurred.

TABLE 1

| | Intermittent short Circuit | | | | |
|---|---|---|---|---|---|
| | Comb. 1 | Comb. 2 | Comb. 3 | Comb. 4 | Comb. 5 |
| Current Value | | | | | |
| A1 ≦ | ○ | | | | |
| A2 ≦ | | ○ | | | |
| A3 ≦ | | | ○ | | |
| A4 ≦ | | | | ○ | |
| A5 ≦ | | | | | ○ |
| Duty Ratio | | | | | |
| D1 ≦ | ○ | | | | |
| D2 ≦ | | ○ | | | |
| D3 ≦ | | | ○ | | |
| D4 ≦ | | | | ○ | |
| D5 ≦ | | | | | ○ |

Table 2 shows the load current ranges defined by the current values A1 to A5 and over current number ranges defined by the numbers K1, K2, K3, K4, K5 (K1<K2<K3<K4<K5). "K1≦overcurrent number<K2" corresponds to "A1≦load current<A2". For, example when A1≦load current<A2 and K1≦overcurrent number<K2, it is determined that an intermittent short circuit has occurred.

TABLE 2

| | Intermittent short Circuit | | | | |
|---|---|---|---|---|---|
| | Comb. 6 | Comb. 7 | Comb. 8 | Comb. 9 | Comb. 10 |
| Current Value | | | | | |
| A1 ≦ | ○ | | | | |
| A2 ≦ | | ○ | | | |
| A3 ≦ | | | ○ | | |
| A4 ≦ | | | | ○ | |
| A5 ≦ | | | | | ○ |
| Overcurrent Number | | | | | |
| K1 ≦ | ○ | | | | |
| K2 ≦ | | ○ | | | |
| K3 ≦ | | | ○ | | |
| K4 ≦ | | | | ○ | |
| K5 ≦ | | | | | ○ |

Table 3 shows the load current ranges defined by the current values A1 to A5, the duty ratio ranges defined by the duty ratios D6, D7, D8, D9, D10 (D5<D6<D7<D8<D9<D10), and the overcurrent number ranges defined by the overcurrent number K6, K7, K8, K9, K10 (K5<K6<K7<K8<K9<K10). For example, "D6≦duty ratio<D7" and "K6≦overcurrent number<K7" correspond to "A1≦load current A2". For example, when the combination is A1≦load current<A2 and D6≦duty ratio<D7 or K1≦overcurrent number<K2, it is determined that an intermittent short circuit has occurred.

TABLE 3

| | Intermittent short Circuit | | | | |
|---|---|---|---|---|---|
| | Comb. 11 | Comb. 12 | Comb. 13 | Comb. 14 | Comb. 15 |
| Current Value | | | | | |
| A1 ≦ | ○ | | | | |
| A2 ≦ | | ○ | | | |
| A3 ≦ | | | ○ | | |
| A4 ≦ | | | | ○ | |
| A5 ≦ | | | | | ○ |
| Duty Ratio | | | | | |
| D6 ≦ | ○ | | | | |
| D7 ≦ | | ○ | | | |
| D8 ≦ | | | ○ | | |
| D9 ≦ | | | | ○ | |
| D10 ≦ | | | | | ○ |
| Overcurrent Number | | | | | |
| K6 ≦ | ○ | | | | |
| K7 ≦ | | ○ | | | |
| K8 ≦ | | | ○ | | |
| K9 ≦ | | | | ○ | |
| K10 ≦ | | | | | ○ |

Tables 1 to 3 are stored in the ROM 7 as maps. The CPU 6 refers to the reference value of each load current range when determining the occurrence of the intermittent short circuit.

(Second Embodiment)

Figure 7:
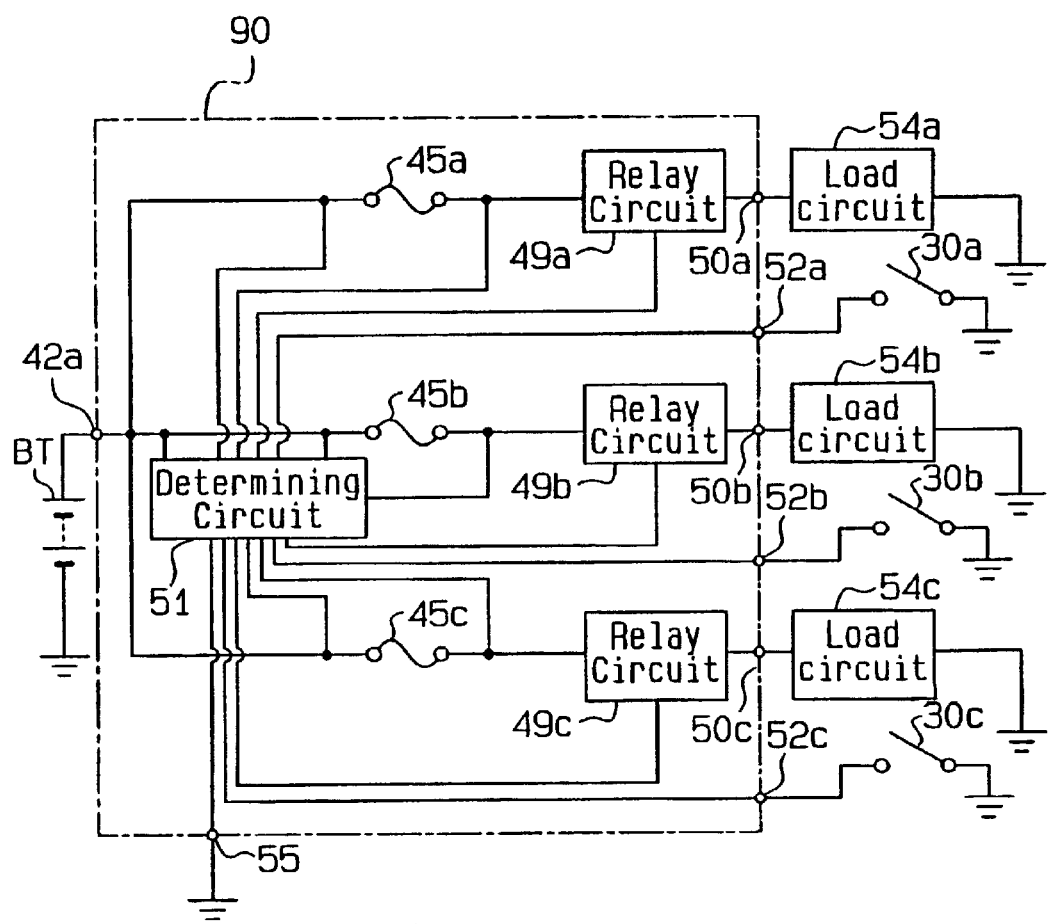
FIG. 7 is a schematic circuit diagram of an intermittent short circuit determining device according to a second embodiment of the present invention.

FIG. 7 is a schematic circuit diagram of an intermittent short circuit determining device 90 according to a second embodiment of the present invention. The intermittent short circuit determining device 90 is embodied in an automobile intermittent short circuit determining device.

Figure 8A:
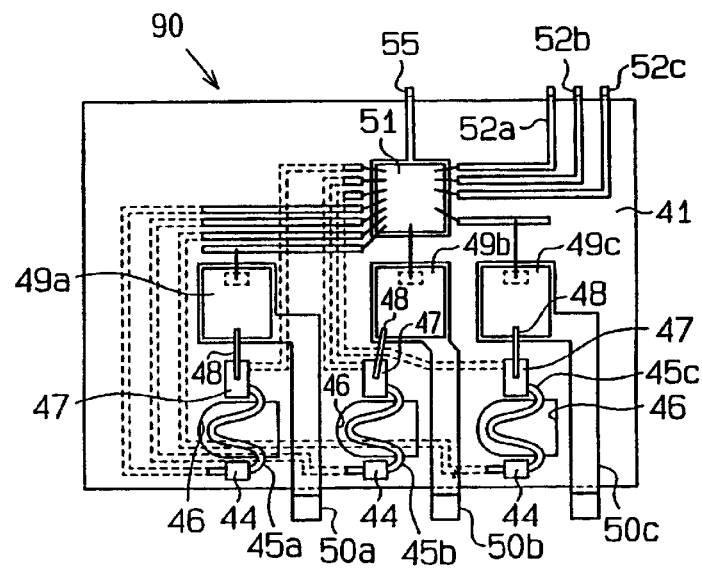
FIG. 8A is a schematic plan view of the intermittent short circuit determining device of FIG. 7.
Figure 8B:
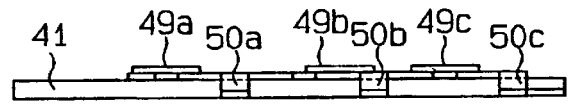
FIG. 8B is a schematic front view of the intermittent short circuit determining device of FIG. 7.
Figure 8C:
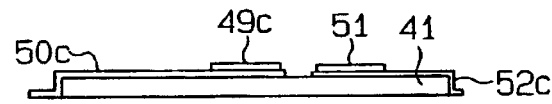
FIG. 8C is a schematic right side view of the intermittent short circuit determining device of FIG. 7.

FIG. 8A is a plan view of the intermittent short circuit determining device 90 without molded material. FIG. 8B is a front view of the determining device 90. FIG. 8C is a right side view of the determining device 90. FIG. 9 is a right side view of the intermittent short circuit determining device 90.

Figure 8D:
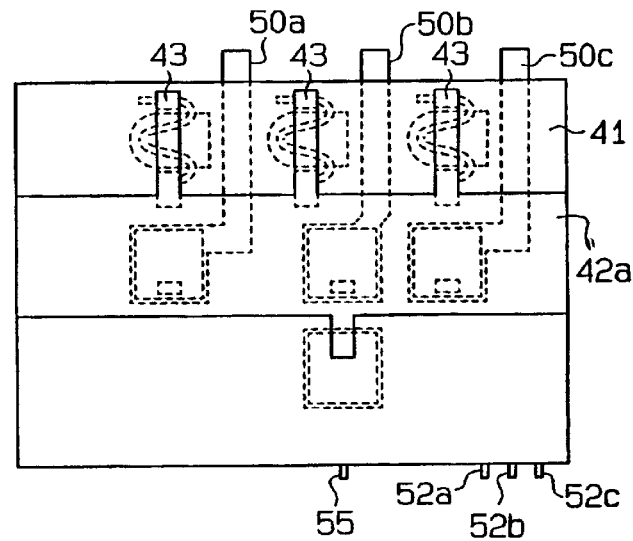
FIG. 8D is a schematic bottom view of the intermittent short circuit determining device of FIG. 7.

In the second embodiment, as shown in FIG. 8D, a rectangular multi-layer insulating substrate 41 has a wide conductive pattern (hereinafter, referred to as the conductive terminal pattern) 42a. The conductive terminal pattern 42a has three branching conductors 43. The branching conductors 43 are connected to lands 44 (see FIG. 8A) through plated through holes (not shown), respectively. The lands 44 and the plated through holes are located on the multi-layer insulating substrate 41 (upper surface in FIG. 8B).

One end of each thin first, second, and third current sensor 45a, 45b, and 45c, the characteristics of which depend on the current capacity, is connected to one of the lands 44. Each first, second, and third current sensor 45a, 45b, and 45c, transverses one of the recesses 46 on the multi-layer insulating substrate 41. Another end of each first, second, and third current sensor 45a, 45b, and 45c, is connected to one of the other lands 47 located on the multi-layer insulating substrate 41.

The lands 47 are connected to the drains (not shown) of the first, second and third FET (relay circuit) 49a, 49b, and 49c by the connecting leads 48, respectively. The current capacity of each connecting lead 48 is greater than that of the corresponding first, second, and third current sensor 45a, 45b, and 45c.

The first, second, and third FETs 49a, 49b, 49c are each fixed to one end of each first, second, and third conductive terminal 50a, 50b, and 50c via the associated sources (not shown). The conductive terminals 50a, 50b, and 50c are located on the multi-layer insulating substrate 41. The other end of each of the first, second, and third conductive terminals 50a, 50b, 50c projects outward from the multi-layer insulating substrate 41.

The determining circuit 51 is fixed to a GND connecting terminal 55 formed on the multi-layer insulating substrate 41. The internal circuit of the determining circuit 51 is grounded via the GND connecting terminal 55. One end of the GND connecting terminal 55 projects outward from the multi-layer insulating substrate 41.

Each land 44 is connected to one end of each first, second, and third current sensor detect terminals (not shown) of the determining circuit 51 via plated through holes (not shown), wiring patterns located on the internal layer of the multi-layer insulating substrate 41, and lead wires.

Each land 47 is connected to the other end of each first, second, and third current sensor detect terminals (not shown) of the determining circuit 51 via the plated through holes (not shown), wiring patterns located on the internal layer of the multi-layer insulating substrate 41, and lead wires.

The first, second, and third output terminal of the determining circuit 51 is connected to the gates (not shown) of the first, second, and third FET 49a, 49b, 49c via lead wires and wiring patterns located on the multi-layer insulating substrate 41, respectively. A power source input terminal (not shown) for the internal circuit, which is located on the back surface of the determining circuit 51, is connected to the conductive terminal pattern 42a via the plated through hole.

Three external signal input terminals of the determining circuit 51 are connected to the first, second, and third signal input terminals 52a, 52b, 52c on the multi-layer insulating substrate 41 via lead wires, respectively. The other end of each first, second, and third signal input terminal 52a, 52b, 52c projects outward from the multi-layer insulating substrate 41.

The first, second, and third signal input terminals 52a, 52b, and 52c are connected to the first, second, and third automobile external switches 30a, 30b, and 30c (see FIG. 7), respectively. The automobile external switches function as the external switch circuit of the automobile. When any of the first, second, and third external switches 30a, 30b, and 30c is switched on, a switch ON signal is provided to the determining circuit 51. When any of the first, second, and third external switches 30a, 30b, and 30c is switched off, a switch OFF signal is provided to the determining circuit 51.

As shown in FIG. 9, each member arranged on the multi-layer insulating substrate 41 is packaged with, for example, the molded material, which is made of epoxy resin. The intermittent short circuit determining device 90 is formed into a flat hexahedron. The first, second, and third conductive terminals 50a, 50b, 50c, the first, second, and third signal input terminals 52a, 52b, 52c, and one end of the GND connecting terminal 55 project outward from the package.

The determining circuit 51 includes an IC and a microcomputer as in the determining circuit 16 of the second embodiment. The determining circuit 51 determines the occurrence of an intermittent short circuit with respect to the first, second, and third current sensors 45a, 45b, and 45c. The determining circuit 51 selectively closes and opens each FET 49a, 49b, and 49c based on the switch ON/OFF signal of the corresponding first, second, and third external switch 30*a*, 30*b*, and 30*c*. The intermittent short circuit determining method and the close/open control of FET 49*a*, 49*b*, 49*c* are equivalent to those of the first embodiment.

The intermittent short circuit determining device 90 is arranged on the terminal block (not shown), which is provided in the electric circuit of automobiles. The first, second, or third current sensor 45*a*, 45*b*, 45*c* breaks and stops the supply of current if the determining circuit 51 of the intermittent short circuit determining device 90 or one of the FET 49*a*, 49*b*, 49*c* fails to operate properly. The failure may occur due to the occurrence of a dead short circuit in one of the load circuits 54*a*, 54*b*, 54*c*. A dead short circuit causes a large amount of current to continuously flow in an electric circuit.

The load circuits 54*a*, 54*b*, 54*c* include, for example, a lamp (headlamp, fog lamp), a radio, or car audio equipment.

The intermittent short circuit determining device 90 of the second embodiment provides the following advantages.

(1) The first, second, and third current sensors 45*a*, 45*b*, 45*c*, and the first, second, and third FET (relay circuit) 49*a*, 49*b*, 49*c* are provided in correspondence with the load circuits 54*a*, 54*b*, 54*c*. The determining circuit 51 determines whether each external switch 30*a*, 30*b*, 30*c* (external switch circuit) is switched on or switched off. The external switches 30*a*, 30*b*, 30*c* are used to select whether to supply or stop supplying the current to the load circuits 54*a*, 54*b*, 54*c*, respectively. The determining circuit 51 selectively activates and inactivates the corresponding first, second, and third FET 49*a*, 49*b*, 49*c*, according to the determination.

Therefore, the determining circuit 51 determines whether an intermittent short circuit has occurred in each load circuit 294*a*, 54*b*, 54*c* separately. Thus, the determining circuit 51 stops the current supply to only the load circuit, in which the intermittent short circuit occurs. The flow of current to the load circuits 54*a*, 54*b*, 54*c* is permitted or stopped in accordance with the operation of the external switches 30*a*, 30*b*, 30*c*, respectively.

It should be apparent to those skilled in the art that the present invention may be embodied in many other specific forms without departing from the spirit or scope of the invention. Particularly, it should be understood that the invention may be embodied in the following forms.

FIGS. 10A, 10B, 11A, 11B illustrate other embodiments of the intermittent short circuit determining device 90 of the second embodiment.

Each intermittent short circuit determining device 90A, 90B, 90C, 90D has substantially the same circuit as in FIG. 7. The conductive terminal 11 is provided in FIGS. 10A, 10B, 11A, 11B instead of the conductive terminal pattern 42*a*.

The intermittent short circuit determining device 90A in FIG. 10A is connected to a circuit substrate in an electric connection box. The first, second, and third conductive terminals 50*a*, 50*b*, 50*c*, the first, second, and third signal input terminals 52*a*, 52*b*, 52*c*, and GND connecting terminal 55 are bent in an L-shaped manner and project from the same side of a molded package 53.

Figure 11A:
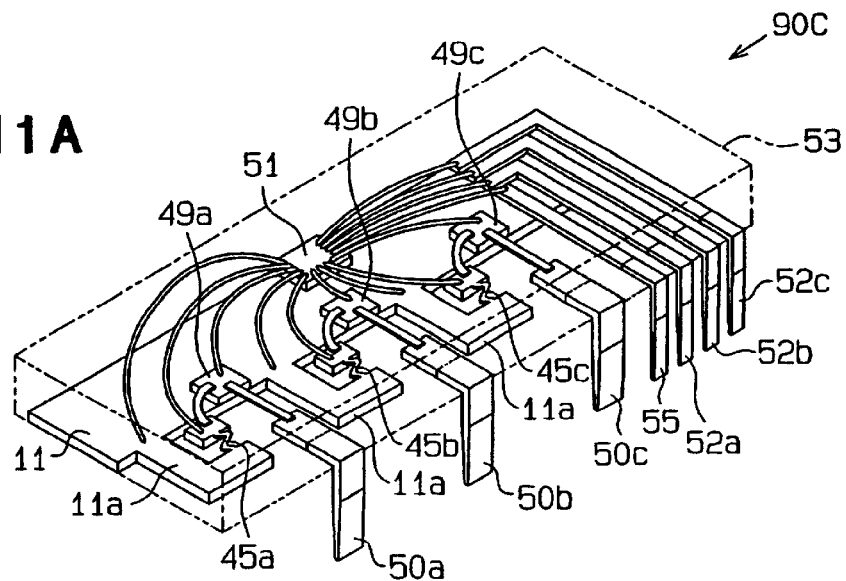
FIG. 11A is a schematic perspective view illustrating a different embodiment of the intermittent short circuit determining device of FIG. 7.

In the intermittent short circuit determining device 90C of FIG. 11A, the first, second, and third conductive terminals 50*a*, 50*b*, 50*c*, the first, second, and third signal input terminals 52*a*, 52*b*, 52*c*, and the GND connecting terminal 55 are bent vertically (downward in FIG. 11A) and project from the same side of the molded package 53.

In the intermittent short circuit determining device 90B of FIG. 10B, the first, second, and third conductive terminals 50*a*, 50*b*, 50*c*, the first, second, and third signal input terminals 52*a*, 52*b*, 52*c*, the GND connecting terminal 55, and the conductive terminal 11 project straightly from the same side of the molded package 53.

Figure 11B:
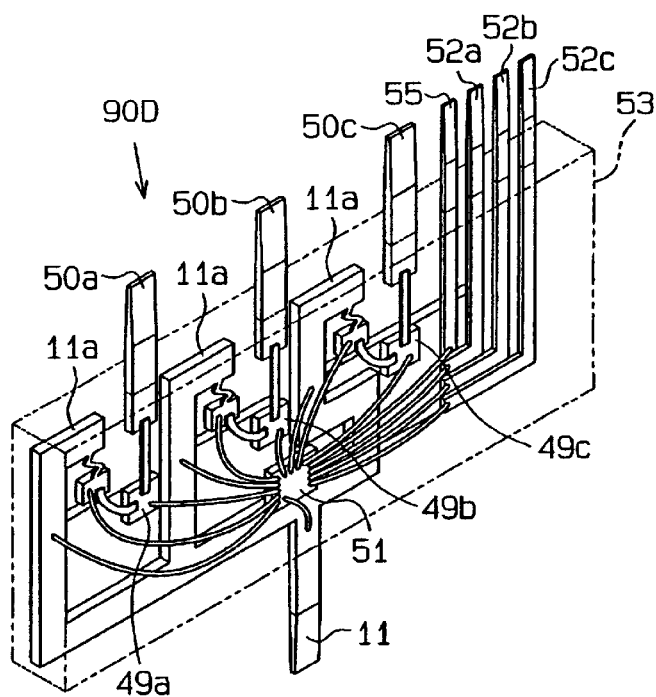
FIG. 11B is a schematic perspective view illustrating a different embodiment of the intermittent short circuit determining device of FIG. 7.

In the intermittent short circuit determining device 90D of FIG. 11B, only the conductive terminal 11 projects straightly from the opposite side of the molded package 53, from which the other terminals project.

Figure 12:
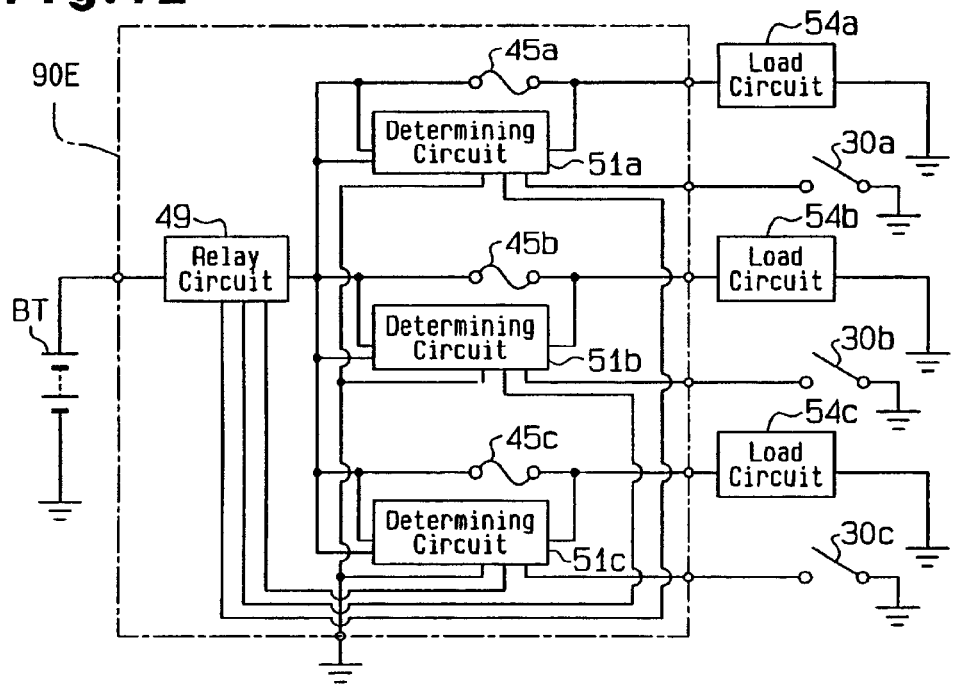
FIG. 12 is a circuit diagram of an intermittent short circuit determining device according to a further embodiment of the present invention.
Figure 13:
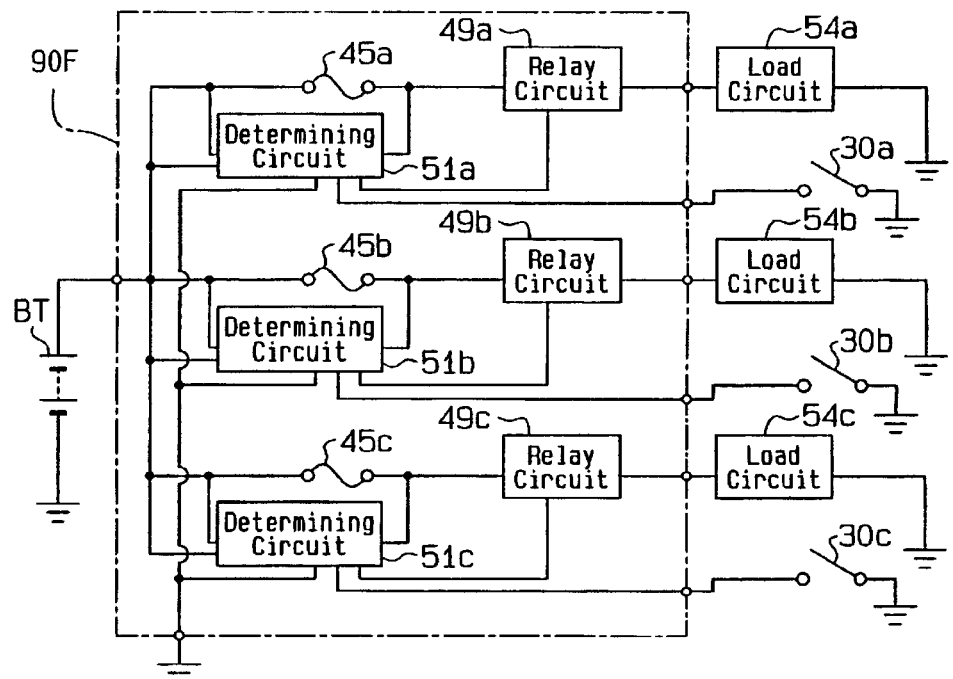
FIG. 13 is a circuit diagram of an intermittent short circuit determining device according to a further embodiment of the present invention.

In the embodiment shown in FIGS. 12 and 13, the configuration of the electric circuit differs from that of the intermittent short circuit determining device 90 of the second embodiment. The differences from the electric circuit of the second embodiment will mainly be discussed below.

The intermittent short circuit determining device 90E of FIG. 12 includes a single FET (relay circuit or disconnecting means) 49, which is connected to the battery BT. Three branching circuits, which are connected to the FET 49, are connected to the first, second, and third current sensors 45*a*, 45*b*, 45*c*, respectively.

The first, second, and third current sensors 45*a*, 45*b*, 45*c* are provided with the determining circuits 51*a*, 51*b*, 51*c*, respectively.

Each determining circuit 51*a*, 51*b*, 51*c* receives the switch ON signal or the switch OFF signal from the corresponding external switch 30*a*, 30*b*, 30*c*. The external switches 30*a*, 30*b*, 30*c* are used to selectively close and open the circuit including the load circuits 54*a*, 54*b*, 54*c*. Each determining circuit 51*a*, 51*b*, 51*c* selectively activates and deactivates the FET 49 according to the switch ON/OFF signal. Each determining circuit 51*a*, 51*b*, 51*c* determines whether an intermittent short circuit has occurred according to the detected voltage (load current) assorts the two terminals of the corresponding current sensor 45*a*, 45*b*, 45*c*. When it is determined that an intermittent short circuit has occurred, the associated determining circuit 51*a*, 51*b*, 51*c* inactivates the FET 49.

The intermittent short circuit determining device 90E is integrated in the molded package as in the second embodiment. In the intermittent short circuit determining device 90E, the load circuits 54*a*, 54*b*, and 54*c* are selectively opened and closed by the single FET 49.

The intermittent short circuit determining device 90F in FIG. 13 includes the circuit configuration, which is equivalent to that of the intermittent short circuit determining device 90 of the second embodiment. In addition, the determining device 90F includes separate determining circuits 51*a*, 51*b*, 51*c* for detecting the voltage on two terminals of each first, second, and third current sensor 45*a*, 45*b*, 45*c*.

Each determining circuit 51*a*, 51*b*, 51*c* receives the switch ON signal or the switch OFF signal from the corresponding external switches 30*a*, 30*b*, 30*c*. The external switches 30*a*, 30*b*, 30*c* are used to selectively close and open the load circuits 54*a*, 54*b*, 54*c* based on the switch ON/OFF signals. Each determining circuit 51*a*, 51*b*, 51*c* selectively activates and inactivates the FET 49*a*, 49*b*, 49*c* separately according to the switch ON/OFF signal. Each determining circuit 51*a*, 51*b*, 51*c* determines whether an intermittent short circuit has occurred according to the detected voltage (load current) on two terminals of the corresponding first, second, and third current sensor 45*a*, 45*b*, 45*c*. When it is determined that an intermittent short circuit has occurred, each determining circuit 51*a*, 51*b*, 51*c* inactivates the FET 49*a*, 49*b*, 49*c* separately. The intermittent short circuit determining device 90F is integrated in the molded package as in the second embodiment.

Figure 14:
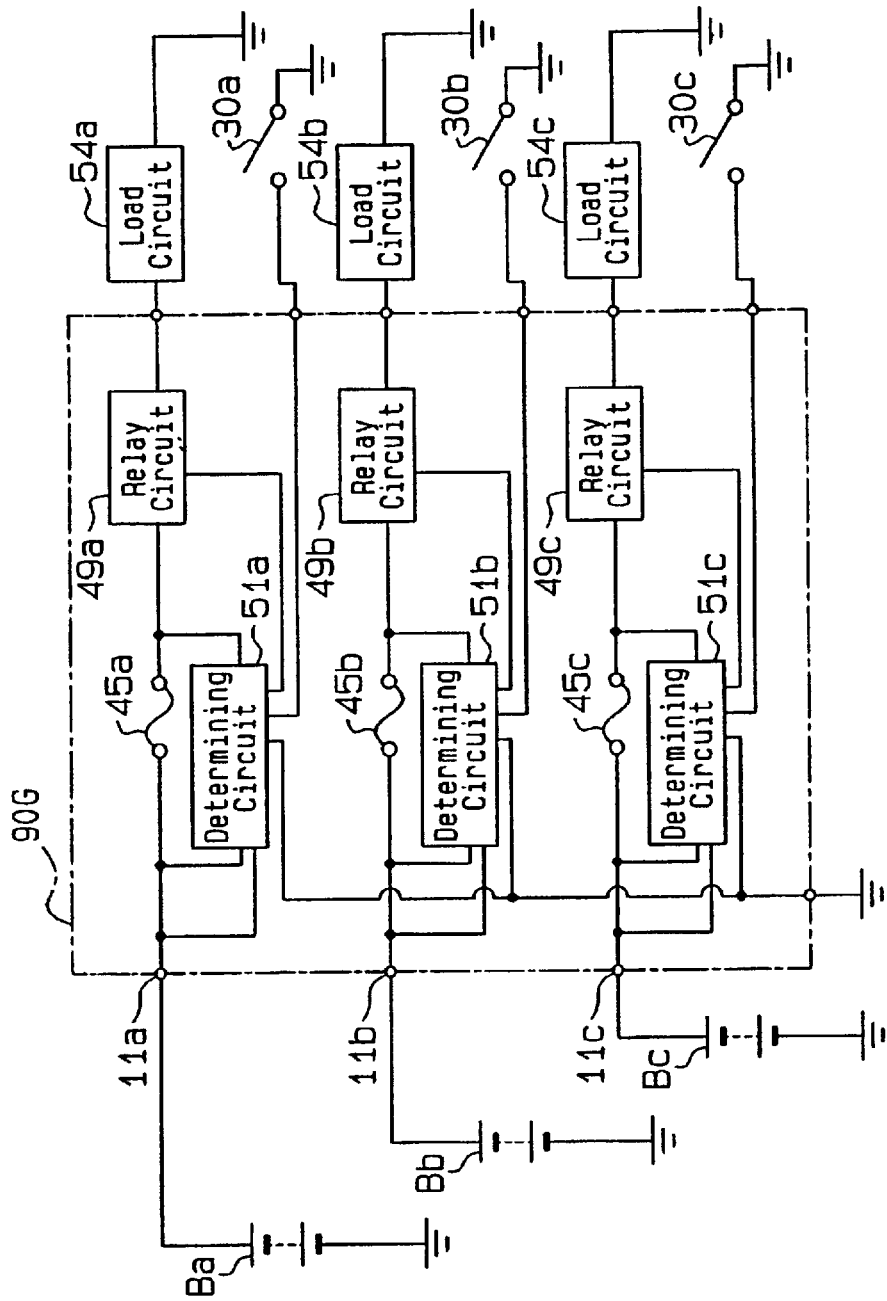
FIG. 14 is a circuit diagram of an intermittent short circuit determining device according to a further embodiment of the present invention.

The circuit of the intermittent short circuit determining device 90G of FIG. 14 includes three circuits of the intermittent short circuit determining device 90, which are parallel. The intermittent short circuit determining device 90G independently determines the occurrence of the intermittent short circuit in each load circuit 294a, 54b, 54c and performs the close/open control of the load current. One of external batteries Ba, Bb, Bc is connected to each independent circuit in the intermittent short circuit determining device 90G.

The current sensor 2 (45a, 45b, 45c) may be an element or circuit that generates a detection signal that is proportional to the load current. For example, a sensor that uses a shunt resistor, a thermistor, or a Hall element may be used.

The determining circuits 16 may be set such that the circuits 16 determine that an intermittent short circuit has occurred in detected current IL if the resistance loss in the current sensor 2 is greater than the predetermined resistance loss.

The determining circuit 16 may also be set such that the circuits 16 determine that an intermittent short circuit has occurred in the load current if the temperature increase caused by the resistance loss in current sensor 2 is greater than the predetermined value.

The determining circuits 16 may be predetermined logic circuits.

The relay circuit may be any circuit, which stops the load current according to the control signal. For example, the relay circuit may be a relay using a semiconductor, or an electromagnetic relay.

The intermittent short circuit determining device of the present invention may be embodied in other than the automobile intermittent short circuit determining device.

Therefore, the present examples and embodiments are to be considered as illustrative and not restrictive and the invention is not to be limited to the details given herein, but may be modified within the scope and equivalence of the appended claims.

What is claimed is:

1. An intermittent short circuit determining device located between a power source and a load circuit in a vehicle electric circuit, the intermittent short circuit determining device compromising:
    means for detecting current flowing through the load circuit;
    means for determining whether the current detected by the detecting means is an intermittent short circuit;
    means for disconnecting the load circuit when the determining means determines that there is an intermittent short circuit;
    wherein the determining means is selectively connected to an external switch circuit, which supplies and stops current to the load circuit, and wherein the determining means determines whether the external switch circuit is switched on or off, and switches the disconnecting means on or off according to said determination.

2. The intermittent short circuit determining device according to claim 1, wherein a fuse is included in the detecting means.

3. The intermittent short circuit determining device according to claim 1, wherein a semi-conductor relay is included in the disconnecting means.

4. The intermittent short circuit determining device according to claim 1, wherein the detecting means, the determining means, and the disconnecting means are integrally packaged.

5. The intermittent short circuit determining device according to claim 1, wherein the detecting means is one of a plurality of detecting means, and each of the detecting means corresponds to a load circuit from a plurality of load circuits, respectively, wherein the disconnecting means is one of a plurality of disconnecting means, and each of the disconnecting means corresponds to a load circuit from said plurality of load circuits, respectively, wherein the determining means is connected to the plurality of detecting means and the plurality of disconnecting means, and the determining means is connected to a plurality of external switch circuits corresponding to the plurality of load circuits, respectively, and each external switch circuit selectively supplies and stops current to the load circuit, and wherein the determining means determines whether the plurality of external switch circuits are switched on or off, and selectively switches the disconnecting means on or off according to said determination.

6. The intermittent short circuit determining device according to claim 1, wherein the detecting means is one of a plurality of detecting means, and each of the detecting means corresponds to a load circuit from a plurality of load circuits, respectively, wherein the disconnecting means is connected between a power source and the plurality of detecting means, and the disconnecting means is able to stop load current supplied to all of the load circuits, and wherein the determining means is one of a plurality of determining means, and each determining means is selectively connected to one of a plurality of external switch circuits, and the plurality of external switch circuits corresponds to the plurality of load circuits, respectively, and each external switch circuit selectively supplies and stops current to the load circuit, and wherein each determining means determines whether the external switch circuit is switched on or off, and selectively switches the disconnecting means on or off according to said determination.

7. The intermittent short circuit determining device according to claim 1, wherein the detecting means is one of a plurality of detecting means, and each of the detecting means corresponds to a load circuit from a plurality of load circuits, respectively, wherein the disconnecting means is one of a plurality of disconnecting means, and each of the plurality of disconnecting means corresponds to a load circuit from the plurality of load circuits, respectively, and wherein the determining means is one of a plurality of determining means, and each determining means is selectively connected to one of a plurality of external switch circuits, and each external switch circuit from the plurality of external switch circuits corresponds to a load circuit from the plurality of load circuits, respectively, and each external switch circuit selectively supplies and stops current to the load circuit, and wherein each determining means determines whether the external switch circuit is switched on or off, and switches the disconnecting means on or off according to the determination.

8. The intermittent short circuit determining device according to claim 7, wherein each of the plurality of detecting means is connected to a corresponding separate power source, and each of the plurality of disconnecting means is able to stop the load current supplied from the corresponding power source.

9. An intermittent short circuit determining device for determining whether an intermittent short circuit has occurred in a load circuit, the intermittent short circuit determining device comprising:
    means for detecting a load current flowing through the load circuit and for generating a detection signal;
    determining means connected to the detecting means, wherein the determining means determines whether an intermittent short circuit has occurred based on the detection signal;
    and disconnecting means connected to the determining means, wherein the disconnecting means stops supply of the load current to the load circuit when it is determined that an intermittent short circuit has occurred, wherein the determining means determines whether an intermittent short circuit has occurred based on at least one of four characteristic quantities, which include the load current flowing through the load circuit, a time period during which the load current exceeds a predetermined current threshold value, an ON-duty ratio indicating the ratio of a time period when the load current exceeds the current threshold value relative to a predetermined time period, and an actual over-current number indicating the number of times that the load current exceeds the current threshold value during a predetermined time period, and wherein the determining means switches the disconnecting means on or off according to said determination.

10. The intermittent short circuit determining device according to claim 9, wherein the detecting means, the determining means, and the disconnecting means are integrally packaged.

11. The intermittent short circuit determining device according to claim 9, wherein when at least two of the four characteristic quantities exceed predetermined reference values, the determining means determines that an intermittent short circuit has occurred.

12. The intermittent short circuit determining device according to claim 11, wherein the detecting means, the determining means, and the disconnecting means are integrally packaged.

13. The intermittent short circuit determining device according to claim 9, wherein the determining means includes a processing circuit which generates a current flow permission signal and a current shutdown signal wherein the current flow permission signal activates the disconnecting means and allows the load current to flow, and the current shutdown signal inactivates the disconnecting means and stops the load current.

14. The intermittent short circuit determining device according to claim 9, wherein the current threshold value is one of a plurality of current threshold values, and the plurality of current threshold values defines a plurality of load current ranges, and each of the plurality of load current ranges is associated with at least one of a reference ON-duty ratio and a reference over-current number, and the determining means compares the load current with the plurality of current threshold values and identifies a load current range wherein the load current belongs, and when at least one of the ON-duty ratio and the actual over-current number exceeds the corresponding reference value associated with the identified load current range, the determining means determines that an intermittent short circuit has occurred.

15. The intermittent short circuit determining device according to claim 14, wherein the determining means includes a storage device for storing the plurality of current threshold values and at lease one of the reference ON-duty ratio and the reference over-current number.

16. A method for determining the occurrence of an intermittent short circuit in a load circuit, wherein the method includes performing at least one of four comparing steps including a current comparison step, a time period comparison step, a duty ratio comparison step, and an over-current number comparison step, wherein the current comparison step comprises comparing the value of load current flowing through the load circuit with a current threshold value, the time period comparing step comprises comparing a time period during which the load current exceeds the current threshold value with a reference time period, the duty ratio comparison step comprises comparing an ON-duty ratio with a reference ON-duty ration, where the ON-duty ratio indicates the ratio of a time period during which the load current exceeds the current threshold value relative to a predetermined time period, and the over-current number comparison step comprises comparing an actual over-current number indicating the number of the times that the load current exceeds the current threshold value during the predetermined time period with a reference over-current number.

17. The determining method according to claim 16, wherein the current threshold value is one of a plurality of current threshold values, and the plurality of current threshold values defines a plurality of load current ranges, and each of the plurality of load current ranges is associated with at least one of the reference ON-duty ratio and the reference over-current number, wherein the current comparing step includes comparing the load current with the plurality of current threshold values and determining a load current range to which the load current belongs, and the determining method further includes determining that an intermittent short circuit has occurred when at least one of the ON-duty ratio and the actual over-current number exceeds the corresponding reference value associated with the determined load current range.

18. A method for determining the occurrence of an intermittent short circuit in a load circuit, wherein the method includes at least two of four comparing steps including a current comparison step, a time period comparison step, a duty ratio comparison step, and an overcurrent number comparison step, wherein the current comparison step comprises comparing the value of a load current flowing through the load circuit with a current threshold value, the time period comparing step comprises comparing a time period during which the load current exceeds the current threshold value with a reference time period, the duty ratio comparison step comprises comparing an ON-duty ratio with a reference ON-duty ratio, and the ON-duty ratio indicates the ratio of a time period during which the load current exceeds the current threshold value relative to a predetermined time period, and the over-current number comparison step comprises comparing an actual over-current number indicating the number of times that the load current exceeds the current threshold value during the predetermined time period with a reference over-current number.

19. The determining method according to claim 18, wherein the current threshold value is one of a plurality of current threshold values, and the plurality of current threshold values define a plurality of load current ranges, and each of the plurality of load current ranges is associated with at least one of the reference ON-duty ratio and the reference over-current number, wherein the current comparing step includes comparing the load current with the plurality of current threshold values and determining a load current range to which the load current belongs, and the determining method further includes determining that an intermittent short circuit has occurred when at least one of the ON-duty ratio and the actual overcurrent number exceeds the corresponding reference value associated with the determined load current range.

20. A method for determining whether an intermittent short circuit has occurred in a load circuit, the method compromising:
    comparing a load current that flows in the load circuit with a first current threshold value;
    comparing the load current with a second current threshold value, the second current threshold value being greater than the first current threshold value;

comparing a first time period, during which the load current exceeds the first current threshold value, with a first reference time period;

comparing a second time period, during which the load current exceeds the second current threshold value, with a second reference time period;

comparing an ON-duty ratio with a reference ON-duty ratio wherein the on-duty ratio is the ratio of a time period when the load current exceeds the second current threshold value relative to a predetermined time period; and comparing an overcurrent number with a reference overcurrent number, wherein the overcurrent number is the number of times that the load current exceeds the second current threshold value during a predetermined time period.

21. The determining method according to claim 20, wherein the method further comprises:

determining that when the load current exceeds the first current threshold value and when the first time period exceeds the first reference time period, an intermittent short circuit has occurred;

determining that when the load current exceeds the second current threshold value and when the second time period exceeds the second reference time period, an intermittent short circuit has occurred;

determining that when the load current exceeds the second current threshold value and when the ON-duty ratio exceeds the reference on-duty ratio an intermittent short circuit has occurred; and determining that when the load current exceeds the second current threshold value and when the actual overcurrent number exceeds the reference over-current number, and intermittent short circuit has occurred.

* * * * *